(12) United States Patent
Yang et al.

(10) Patent No.: US 9,581,639 B2
(45) Date of Patent: Feb. 28, 2017

(54) ORGANIC SPACE TRANSFORMER ATTACHMENT AND ASSEMBLY

(71) Applicants: Jin Yang, Hillsboro, OR (US); Erkan Acar, Hillsboro, OR (US); Todd P. Albertson, Warren, OR (US); Joe F. Walczyk, Tigard, OR (US)

(72) Inventors: Jin Yang, Hillsboro, OR (US); Erkan Acar, Hillsboro, OR (US); Todd P. Albertson, Warren, OR (US); Joe F. Walczyk, Tigard, OR (US)

(73) Assignee: INTEL CORPORATION, Santa Clara, CA (US)

( * ) Notice: Subject to any disclaimer, the term of this patent is extended or adjusted under 35 U.S.C. 154(b) by 89 days.

(21) Appl. No.: 14/142,752

(22) Filed: Dec. 28, 2013

(65) Prior Publication Data
US 2015/0185252 A1    Jul. 2, 2015

(51) Int. Cl.
*G01R 1/073* (2006.01)
*G01R 31/28* (2006.01)
*H05K 3/32* (2006.01)

(52) U.S. Cl.
CPC ......... *G01R 31/2889* (2013.01); *H05K 3/325* (2013.01); *Y10T 29/4902* (2015.01)

(58) Field of Classification Search
CPC .................................................. G01R 1/073
See application file for complete search history.

(56) References Cited

U.S. PATENT DOCUMENTS

| | | | |
|---|---|---|---|
| 6,671,947 B2 | 1/2004 | Bohr | |
| 7,759,776 B2 | 7/2010 | Cheng | |
| 2004/0266089 A1* | 12/2004 | Mathieu | G01R 3/00 438/202 |
| 2005/0237073 A1* | 10/2005 | Miller et al. | 324/754 |
| 2010/0065963 A1* | 3/2010 | Eldridge et al. | 257/734 |
| 2010/0176831 A1* | 7/2010 | Palcisko et al. | 324/757 |
| 2011/0101190 A1* | 5/2011 | Morren et al. | 248/316.5 |
| 2013/0069686 A1* | 3/2013 | Wu et al. | 324/756.03 |
| 2014/0062522 A1 | 3/2014 | Acar et al. | |

* cited by examiner

*Primary Examiner* — Tung X Nguyen
*Assistant Examiner* — Feba Pothen
(74) *Attorney, Agent, or Firm* — Konrad Raynes Davda & Victor LLP; Alan S. Raynes (57) ABSTRACT

Electronic device assemblies and methods including an organic substrate based space transformer are described. One assembly includes a space transformer comprising an organic substrate. The assembly also includes a carrier on which the space transformer is positioned, and a clamp positioned to couple the space transformer to the carrier. The assembly also includes a probe array positioned on the space transformer, wherein the space transformer is positioned between the probe array and the carrier. The assembly also includes a printed circuit board, wherein the carrier is positioned between the printed circuit board and the space transformer. The assembly also includes electrical connections to electrically couple the space transformer to the printed circuit board. Other embodiments are described and claimed.

21 Claims, 5 Drawing Sheets

ORGANIC SPACE TRANSFORMER ATTACHMENT AND ASSEMBLY

BACKGROUND

Semiconductor devices are often tested to ensure their functionality. Testing may be carried out at the wafer level, prior to individual chips being diced apart and packaged. Wafer level testing may include the use of test probes that are brought into electrical contact with pads on the devices to be tested. Such testing of devices on the wafer is commonly known as "wafer sort". Devices that fail the testing may be marked and sorted accordingly during a subsequent wafer dicing process.

A wafer sort assembly may include a number of components, including, but not limited to, a probe head coupled to a printed circuit board (PCB) that acts as a sort interface unit (SIU). The PCB is electrically coupled to a tester. The probe head may include test probes that are electrically coupled to a space transformer that is electrically coupled to the PCB. The space transformer generally serves as a pitch transfer medium from a high-density first level interconnect (FLI) to a lower density second level interconnect (SLI). The space transformer proves an electrical path between the FLI and the SLI with internal routing, through which the FLI inputs/outputs (I/Os) are routed through the space transformer and printed circuit board (PCB) to the tester. A force retainer plate (FRP) structure may be utilized to serve as datum and loading frame for the SIU.

BRIEF DESCRIPTION OF THE DRAWINGS

Embodiments are described by way of example, with reference to the accompanying drawings, which are not drawn to scale.

DETAILED DESCRIPTION

Reference below will be made to the drawings wherein like structures may be provided with like reference designations. In order to show the structures of various embodiments most clearly, the drawings included herein include diagrammatic representations of various structures. Thus, the actual appearance of the fabricated structures may appear different while still incorporating the claimed structures of the illustrated embodiments. Moreover, the drawings may show only the structures necessary to understand the illustrated embodiments. Additional structures known in the art have not been included to maintain the clarity of the drawings.

The space transformer in a wafer sort assembly has typically been formed from a multi-layer ceramic. The probe head, which may include the space transformer, an array of probes, and a corresponding assembly fixture, is coupled to the PCB that is in turn electrically coupled to the tester. The probe head acts as a temporary electrical interface between the tester and the device (for example, wafer) to be tested. Elements that may affect probing performance during wafer sort include, but are not limited to, probe head/probe array tip coplanarity, probe actual over travel and corresponding probing force between the wafer bump and each probe, signal integrity of overall assembly, and space transformer deformation and reliability under cyclic probing load. Multi-layer ceramic (MLC) based space transformer structures have useful stiffness and thermal expansion properties, because the MLC has a relatively low coefficient of thermal expansion and a relatively high stiffness (Young's Modulus). However, due to increasing complexity of electrical routing, the manufacturing costs for forming MLC based space transformer structures have risen substantially.

Certain embodiments relate to the use of a space transformer that comprises an organic substrate based space transformer. Such an organic substrate based space transformer comprises an organic substrate including one or more layers of organic material and electrical pathways extending therethrough. In certain configurations, multiple layers of organic material may be laminated together. When compared with MLC based structures, organic substrate based structures generally have a lower stiffness and higher coefficient of thermal expansion. In addition, organic substrate based structures are typically formed thinner than MLC based structures. A thinner structure provides certain advantages related to the ability to form a more narrow device. For example, in certain embodiments, an organic substrate based space transformer may have a thickness of 1 mm or less. However, due to the thickness and material stiffness reduction of the organic substrate based space transformer structure, problems relating to probe tip coplanarity in the assembly process, probe actual over travel, and permanent deformation and reliability of the organic space transformer may occur.

In addition, embodiments permit the probe head including the organic substrate based space transformer to be removable so that it can be changed when desired, for example, when damaged. To be removable, the probe head including the organic substrate based space transformer is coupled to the PCB/SIU in a manner that in certain embodiments utilizes assembly operations that are reversible, such as, for example, mechanical operations including, but not limited to, using screws to hold certain components together.

Figure 1:
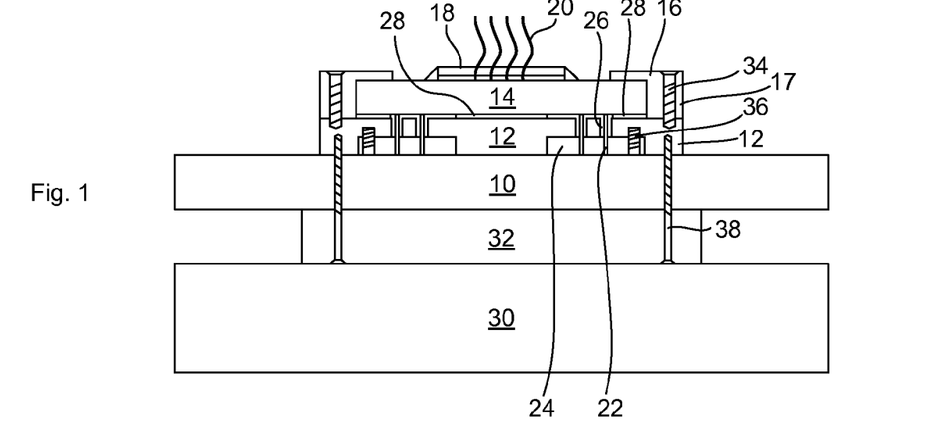
FIG. 1 illustrates an assembly including an organic substrate based space transformer, in accordance with certain embodiments.

FIG. 1 illustrates an assembly including an organic substrate based space transformer 14 on a PCB 10, in accordance with certain embodiments. The organic substrate based space transformer 14 is positioned on a carrier 12. An adhesive 28 such as an epoxy may be positioned between the organic substrate based space transformer 14 and the carrier 12. A clamp 16 may be positioned to hold the organic substrate based space transformer 14 on the carrier 12. An attachment mechanism such as, for example, screws 34 may be used to couple the clamp 16 to the carrier 12, to apply force to hold the organic substrate based space transformer 14 on the carrier 12. By coupling the organic substrate based space transformer 14 to the carrier 12 using the adhesive 28 and the clamp 16, a more rigid assembly may be formed than if the organic substrate based space transformer were positioned directly on the PCB 10. A probe assembly including probe holder 18 and probes 20 are positioned on the organic substrate based space transformer 14.

The carrier 12 as illustrated in the embodiment of FIG. 1 includes openings 26 to accommodate SLI spring pins 22 to serve as electrical paths between the organic substrate based space transformer 14 and the PCB 10 and integrate an interposer into the overall assembly. The spring pins 22 may be positioned in a pin holder 24. Attachment mechanism such as screws 36 may be used to couple the pin holder 24 to the carrier 12. The pin holder 24 and carrier 12 may constitute an interposer structure that delivers electrical signals between the PCB 10 and the organic substrate based space transformer 14. If desired, alignment features such as, for example, alignment pins, may be added to extend between the pin holder 24 and the PCB 10, and between the pin holder 24 and the organic substrate based space transformer 14, to ensure proper alignment between the components.

As illustrated in FIG. 1, the organic substrate based space transformer 14 is sandwiched between the carrier 12 and the clamp 16 and the assembly may be temporarily coupled to the PCB 10 using a coupling mechanism such as screws 38. The various components including the carrier 12, the clamp 16, and the PCB are reusable based on this architecture. The organic substrate based space transformer 14 may be bonded onto the carrier using an adhesive and using screws 34 to improve the stiffness characteristics of the assembly from that of the organic substrate material itself. The improved stiffness acts to minimize elastic and/or plastic deformation of the organic substrate based space transformer 14 and as a result the problems related to probe tip coplanarity and probe actual over travel in probe assembly and probing processes will be mitigated. The probing force is mainly transferred from the organic substrate based space transformer through a central portion of the carrier 12 to the PCB 10, which should lead to improved durability of the organic substrate based space transformer 14 and the pins 22.

As illustrated in FIG. 1, the PCB 10 may be positioned on a probe head support 32 that is positioned on force retainer plate 30. If desired, an attachment mechanism such as screws 38 may be positioned to extend through the probe head support 32, through the PCB 10, and into the carrier 12, to assist in holding the components together. The PCB 10 is electrically coupled to a tester. The probes 20 may be brought into contact with a structure to be tested such as a wafer or die including integrated circuit devices.

Figure 2:
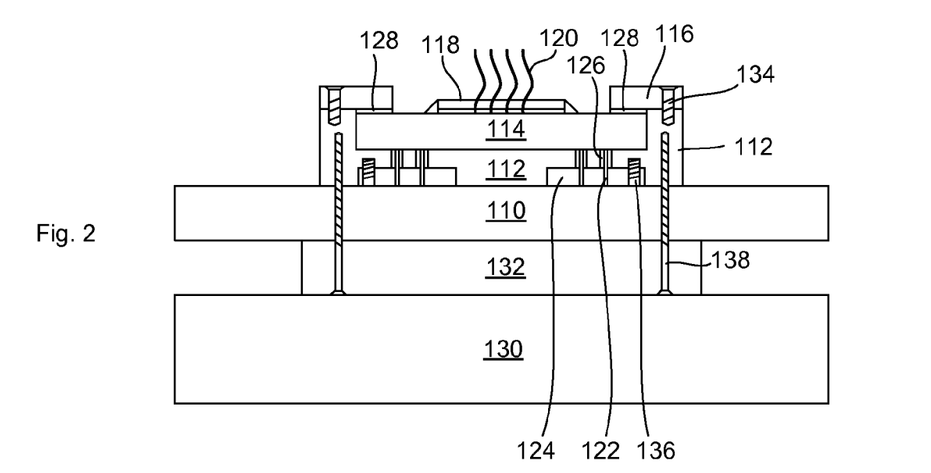
FIG. 2 illustrates an assembly including an organic substrate based space transformer, in accordance with certain embodiments.

FIG. 2 illustrates an assembly including an organic substrate based space transformer 114 on a PCB 110, in accordance with certain embodiments. The organic substrate based space transformer 114 is positioned on a carrier 112, and a clamp 116 may be positioned to hold the organic substrate based space transformer 114 on the carrier 112. As illustrated in FIG. 2, an adhesive 128 such as an epoxy may be positioned between the organic substrate based space transformer 114 and the clamp 116. In addition, an attachment mechanism such as, for example, screws 134 may be used to couple the clamp 116 to the carrier 112, to apply force to hold the organic substrate based space transformer 114 on the carrier 112. A probe assembly including probe holder 118 and probes 120 are positioned on the organic substrate based space transformer 114.

Similar to FIG. 1, the assembly of FIG. 2 includes openings 126 to accommodate SLI spring pins 122 to serve as electrical paths between the organic substrate based space transformer 114 and the PCB 110 and integrate an interposer into the overall assembly. The spring pins 122 may be positioned in a pin holder 124. Other types of electrical connection mechanisms in addition to pins may also be used. Attachment mechanism such as screws 136 may be used to couple the pin holder 124 to the carrier 112. Other types of attachments mechanisms may also be used. In addition, the PCB 110 may be positioned on a probe head support 132 that is positioned on force retainer plate 130. If desired, an attachment mechanism such as screws 138 may be positioned to extend through the probe head support 132, through the PCB 110, and into the carrier 112, to assist in holding the components together. The PCB 110 is electrically coupled to a tester. The probes 120 may be brought into contact with a structure to be tested such as a wafer or die including integrated circuit devices. In certain embodiments, the probes may have a pitch in the range of 45 to 135 microns. Other pitches are also possible.

The structure of the assembly in FIG. 2 differs from that illustrated in FIG. 1. In the embodiment illustrated in FIG. 1, the adhesive 28 is positioned between the organic substrate based space transformer 14 and the carrier 12, which results in the carrier acting as a stiffener positioned below the space transformer 14. In FIG. 2, the adhesive 128 is positioned between the organic substrate based space transformer 114 and the clamp 116, which results in the clamp 116 acting as a stiffener positioned on the space transformer 114. In addition, the shape of the carrier 112 and the clamp 116 in FIG. 2 may differ from that of the carrier 12 and clamp 16 in FIG. 1. As illustrated in FIG. 1, the clamp 16 may include a region that extends directly over a portion of the organic substrate based space transformer 14 and a side region 17 that extend downward past the outer edge of the organic substrate based space transformer 14 and are positioned on the carrier 12. As illustrated in FIG. 2, the carrier 112 includes side portions 119 that extend upward past the outer edge of the organic substrate based space transformer 114, and as a result the clamp 116 does not extend downward past the outer edge of the organic substrate based space transformer 144 as does the side region 17 of the clamp 16 in FIG. 1. In addition, as illustrated in the Figures, the clamp 116 in FIG. 2 extends a distance above the organic substrate based space transformer 114 that is greater than that of the clamp 16 in FIG. 1. This may be seen in the Figures because the clamp 116 in FIG. 2 has an upper position that extends higher than that of the probe holder 118, wherein the clamp 16 in FIG. 1 has an upper position that does not extend higher than that of the probe holder 18. This greater thickness above the space transformer 114 permits the clamp 116 to act more effectively as a stiffener when bonded to the space transformer 114. Other structural variations are also possible.

Figure 3:
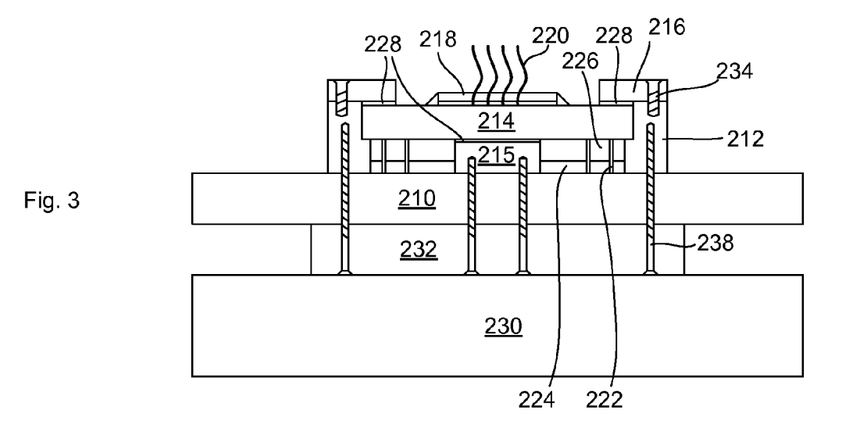
FIG. 3 illustrates an assembly including an organic substrate based space transformer, in accordance with certain embodiments.

FIG. 3 illustrates an assembly including an organic substrate based space transformer 214 on a PCB 210, in accordance with certain embodiments. The organic substrate based space transformer 214 is positioned on a carrier 212 and a support 215, and a clamp 216 may be positioned to hold the organic substrate based space transformer 214 on the carrier 212. As illustrated in FIG. 3, an adhesive 228 may be positioned between the organic substrate based space transformer 214 and the clamp 216. The adhesive 228 may also be positioned between the organic substrate based space transformer and the support 215. The adhesive may assist in holding components together and may also act to increase the stiffness of the structure. In addition, an attachment mechanism such as, for example, screws 234 may be used to couple the clamp 216 to the carrier 212, to apply force to hold the organic substrate based space transformer 214 on the carrier 212. A probe assembly including probe holder 218 and probes 220 are positioned on the organic substrate based space transformer 214.

The assembly of FIG. 3 includes an open region 226 to accommodate SLI spring pins 222 to serve as electrical paths between the organic substrate based space transformer 214 and the PCB 210 and integrate an interposer into the overall assembly. The spring pins 222 may be positioned in a pin holder 224. The pin holder 224 may in certain embodiments be substantially ring-like in shape, with the support 215 being positioned in the center of the ring. The center portion of the organic substrate based space transformer is positioned on the support 215. The support 215 is a separate structure from the carrier 212. Such a configuration is designed to simplify the manufacturing complexity of the carrier from that of FIGS. 1 and 2.

In addition, the PCB 210 may be positioned on a probe head support 232 that is positioned on force retainer plate 230. If desired, an attachment mechanism such as screws 238 may be positioned to extend through the probe head support 232, through the PCB 210, and into the carrier 212, to assist in holding the components together. Similarly, an attachment mechanism such as screws 239 may be positioned to extend through the probe head support 232, through the PCB 210, and into the support 215, to assist in holding the components together. The PCB 210 is electrically coupled to a tester. The probes 220 may be brought into contact with a structure to be tested such as a wafer including integrated circuit devices formed thereon.

Figure 4A:
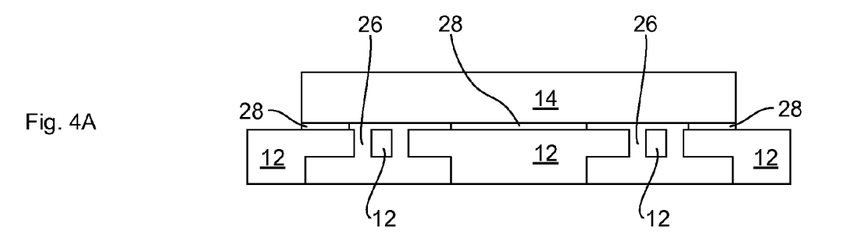
FIGS. 4A-4E illustrate operations for forming an assembly including an organic substrate based space transformer, in accordance with certain embodiments.
Figure 4B:
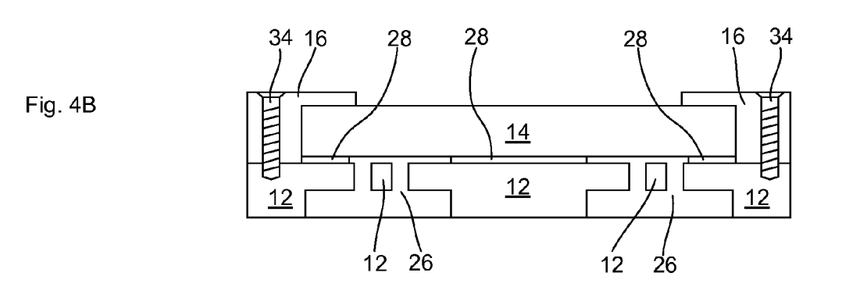

FIGS. 4A-4E illustrate the formation of an assembly in accordance with certain embodiments, including certain features illustrated in FIG. 1. As illustrated in FIG. 4A, an organic substrate based space transformer 14 is bonded onto a carrier 12 using an adhesive 28 such as an epoxy. The carrier 12 includes openings 26 through which pins will be positioned to electrically couple the organic substrate based space transformer 14 to a PCB. FIG. 4B illustrates assembling a clamp 16 onto the organic substrate based space transformer 14 to sandwich the space transformer 14 between the clamp 16 and the carrier 12. An attachment mechanism including, but not limited to, screws 34, may be used to couple the clamp 16 to the carrier 12.

Figure 4C:
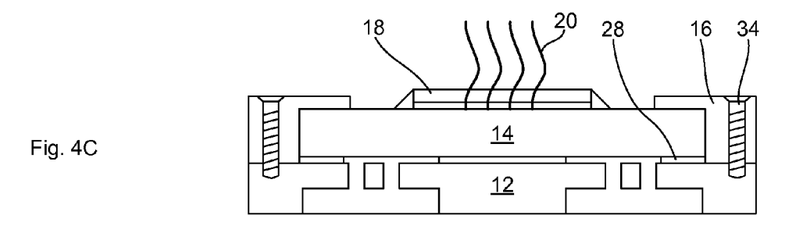

FIG. 4C illustrates a probe assembly including an array of probes 12 and probe holder 18 positioned on the organic substrate based space transformer 14 using any suitable coupling mechanism, including but not limited to, using an adhesive 28 such as an epoxy to couple the probe holder 18 to the organic substrate based space transformer 14.

Figure 4D:
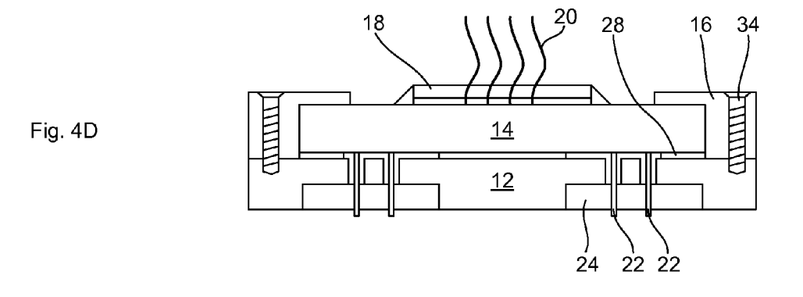

FIG. 4D illustrates positioning a pin holder 24 and second level interconnect pins 22 so that the space transformer may be electrically coupled to a PCB through the pins 22. The pins 22 extend through the opening 26 in the carrier 12. The pins 22 may in certain embodiments include a spring mechanism to ensure satisfactory electrical contact is made. Any suitable mechanism for making electrical contact from the organic substrate based space transformer 14 to the PCB may be utilized. For example, structures other than pins may be utilized in certain embodiments.

Figure 4E:
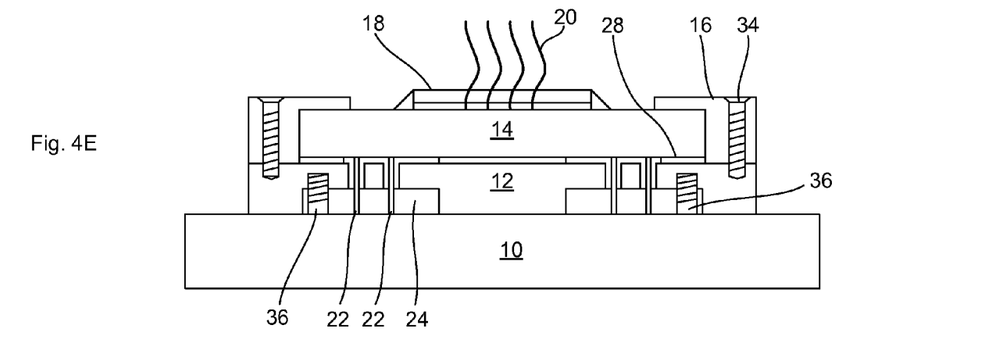

FIG. 4E illustrates positioning the assembly on a PCB 10. In certain embodiments, prior to the positioning the assembly on the PCB 10, the probe tips on the probes 20 may be planarized. FIG. 4E also shows screws 36 which may be used to couple the pin holder 24 to the carrier 12.

Figure 5:
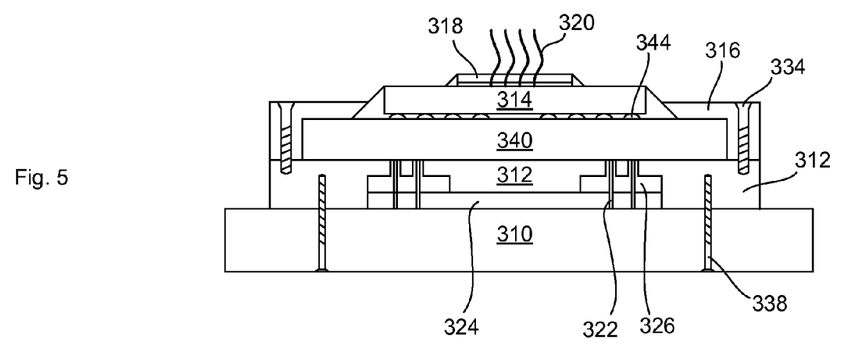
FIG. 5 illustrates an embodiment including an organic substrate based space transformer positioned on a daughter board, in accordance with certain embodiments.

FIG. 5 illustrates an embodiment wherein an organic substrate based space transformer 314 is positioned on a daughter board 340 that is in turn electrically coupled to a PCB 310. The daughter board 340 may be formed from any suitable material, including, but not limited to, an FR4 glass epoxy material, a bismaleimide-triazine (BT) material, and a ceramic material. The positioning of the organic substrate based space transformer 314 on the daughter board 340 may be carried out using any suitable coupling mechanism, including, but not limited to, solder interconnections 344 that electrically couple the organic substrate based space transformer 314 and the daughter board 340. The daughter board 340 may be positioned on a carrier 312, and a clamp 316 may be positioned on the daughter board 340 to apply a force to sandwich the daughter board 340 between the carrier 312 and the clamp 316. A mechanism such as screws 334 may be used to couple the clamp 316 to the carrier 312 and apply a force to the daughter board 340. Pins 322 may extend through openings 326 in the carrier 312, in order to provide electrical pathways between the PCB 310 and the daughter board 340. A pin carrier 324 may be utilized within the assembly to hold and properly position the pins 322. Screws 338 may be used in certain embodiments to couple the PCB 310 to the carrier 312. Assemblies including a daughter board may include different configurations from that illustrated in FIG. 5, including for example, a clamp that extends over a portion of the organic substrate based space transformer in a manner similar to the embodiments illustrated in FIGS. 1-3. In addition, an assembly including a structure with a support positioned between the PCB and the daughter board, and a carrier that extends between the PCB and the daughter board (similar to that illustrated in FIG. 3) may also be utilized. Other variations are also possible.

An architecture such as that illustrated in FIG. 5, with an organic substrate based space transformer 314 coupled to a board 340, may permit the formation of a stiffer structure, which in turn may permit the application of a greater pin force. For example, such a structure (FIG. 5) may permit the utilization of a pin force in a range of up to about 100 gf/pin. The ability to utilize a greater pin force provides greater design flexibility and more options relating to the specific pins used. Such options may relate to features including, but not limited to, the pitch, stroke, force, and working length of the pin from thermal and mechanical perspectives.

Figure 6:
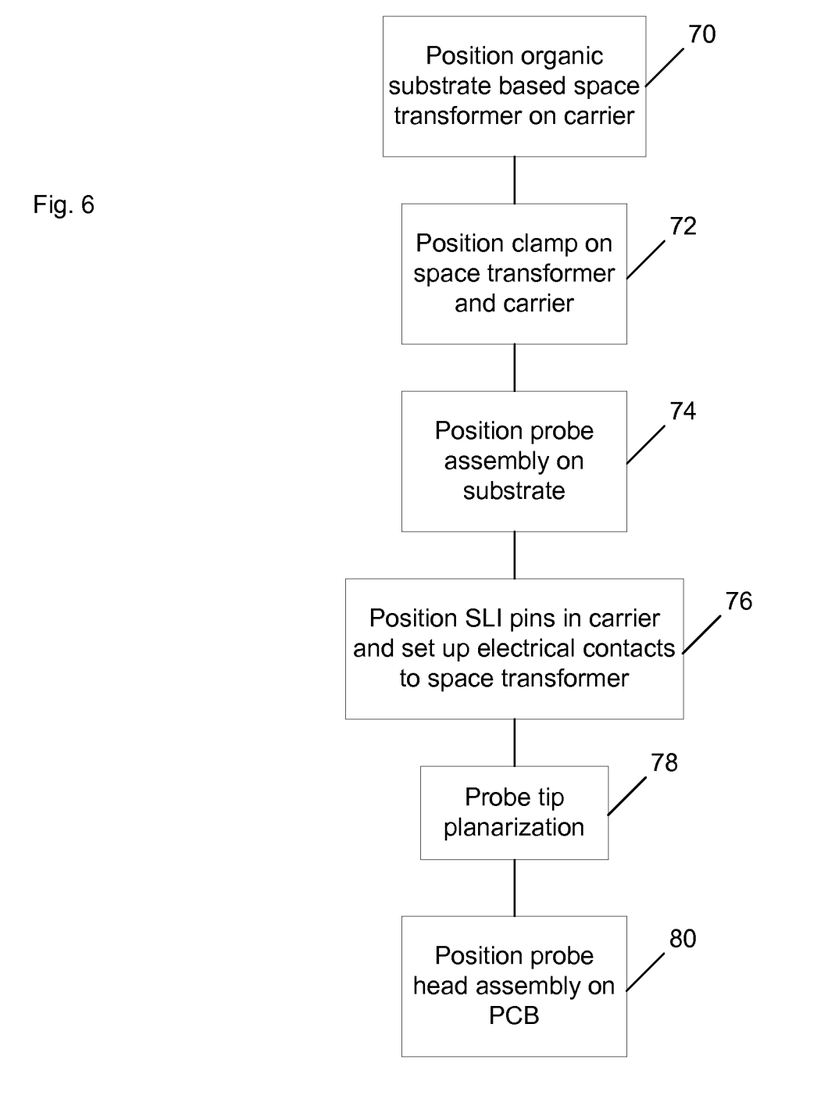
FIG. 6 illustrates a flowchart of operations for forming an assembly including an organic substrate based space transformer, in accordance with certain embodiments.

FIG. 6 is a flowchart of operations that may be carried out in accordance with certain embodiments. Box 70 is positioning an organic substrate based space transformer on a carrier. In certain embodiments an adhesive such as an epoxy may be used to bond the space transformer to the carrier. Box 72 is clamping the organic substrate based space transformer to the carrier. This may be carried out in certain embodiments by positioning a clamp that extends over a portion of the space transformer and then coupling the clamp to the carrier using a suitable mechanism, including, but not limited to, screws that are positioned to extend from the clamp into the carrier. The clamp may have include a variety of suitable structures, including, but not limited to, a plate-like structure that is substantially flat such as clamp 116 illustrated in FIG. 2, and a plate-like structure having a bend therein such as the clamp 16 having side region 17 that extends downward as illustrated in FIG. 1. The clamp and carrier may be formed from any suitable material, including, but not limited to, stainless steel. Box 74 is positioning a probe assembly on the space transformer. The probe assembly may include a probe holder and an array of probes to be used during testing procedures. Any suitable probe assembly may be utilized. Box 76 is positioning pins that extend through the carrier and provide electrical contacts between the space transformer and the PCB. Box 78 is probe tip planarization. Box 78 is positioning the assembly on a PCB. Any suitable coupling technique may be used, including, for example, the use of screws to hold various components together. In certain embodiments, the PCB may be positioned on a probe head support that is positioned on a force retainer plate. The PCB may be electrically coupled to a tester and the probes may be brought into contact with a structure to be tested such as a wafer or singulated die in order to perform testing on the integrated circuit devices formed thereon. A variety of modifications to the operation described above may be made. For example, the organic substrate based space transformer may be bonded to the clamp using the adhesive, instead of being bonded to the carrier using the adhesive. In addition, the order of some of the operations may be modified.

Certain embodiments as described above provide the ability to temporarily and removably couple a probe array and organic substrate based space transformer assembly to a PCB. By forming embodiments of the assembly to including removable components, if one part fails, the entire assembly including the PCB, space transformer, and probe array need not be disposed of because the individual component may be replaced. Adhesive material (for example, epoxy) positioned between components may be removed, if necessary, using any suitable process including, but not limited to, the use of heat, chemical, and mechanical removal methods. In addition, the various components that the organic substrate based space transformer is coupled to in certain embodiments (e.g., the clamp and carrier structures) act to stiffen the space transformer to provide better mechanical and reliability properties. In addition, embodiments may utilize a variety of attachment mechanisms and electrically conductive attachment mechanisms.

Terms such as "first", "second", and the like may be used herein and do not necessarily denote any particular order, quantity, or importance, but are used to distinguish one element from another. Terms such as "upper", "lower", "top", "bottom", and the like may be used for descriptive purposes only and are not to be construed as limiting. Embodiments may be manufactured, used, and contained in a variety of positions and orientations.

EXAMPLES

The following examples pertain to embodiments.

Example 1 is an electronic device assembly comprising: a space transformer comprising an organic substrate; a carrier on which the space transformer is positioned; a clamp positioned to couple the space transformer to the carrier; a probe array positioned on the space transformer, wherein the space transformer is positioned between the probe array and the carrier; a printed circuit board, wherein the carrier is positioned between the printed circuit board and the space transformer; and electrical connections to electrically couple the space transformer to the printed circuit board.

In Example 2, the subject matter of Example 1 may optionally include the electrical connections to electrically couple the space transformer to the printed circuit board extending through the carrier.

In Example 3, the subject matter of any of Examples 1-2 may optionally include the electrical connections comprising a plurality of pins.

In Example 4, the subject matter of Examples 1-3 may optionally include a plurality of screws through which the carrier is removably coupled to the printed circuit board.

In Example 5, the subject matter of any of Examples 1-4 may optionally include the carrier including an open region in a central portion thereof, and wherein a support structure is positioned within the open region, and wherein a central portion of the space transformer is positioned on the support structure.

In Example 6, the subject matter of Examples 1-5 may optionally include the clamp extending above the space transformer a distance greater than that of the probe array.

In Example 7, the subject matter of any of Examples 1-5 may optionally include the clamp extending above the space transformer a distance less than that of the probe array.

In Example 8, the subject matter of any of Examples 1-6 may optionally include a daughter board positioned between the space transformer and the carrier, wherein the space transformer is electrically coupled to the daughter board.

In Example 9, the subject matter of Example 8 may optionally include wherein the space transformer is positioned on the daughter board, and wherein the clamp is positioned to apply a force to the daughter board to couple the daughter board and the space transformer positioned thereon to the carrier.

Example 10 is an electronic device assembly comprising: a space transformer comprising an organic substrate; a probe array comprising a plurality of test probes, the probe array positioned on the space transformer and electrically coupled thereto; a carrier on which the based space transformer is positioned; a clamp coupled to the carrier, the clamp positioned to hold the space transformer on the carrier; and a printed circuit board, wherein the carrier is positioned between the printed circuit board and the space transformer, wherein the carrier is removably coupled to the printed circuit board.

In Example 11, the subject matter of any of Examples 1-10 may optionally include wherein the space transformer is bonded to at least one of the carrier and the clamp using an adhesive.

In Example 12, the subject matter of Example 11 may optionally include wherein the adhesive comprises an epoxy.

In Example 13, the subject matter of any of Examples 1-12 may optionally include wherein the clamp is removably coupled to the carrier.

In Example 14, the subject matter of any of Examples 1-13 may optionally include wherein the carrier is removably coupled to the printed circuit board using a plurality of screws, and the clamp is removably coupled to the carrier using a plurality of screws.

In Example 15, the subject matter of any of Examples 10-14 may optionally include electrical connections extending from the space transformer to the printed circuit board.

In Example 16, the subject matter of Example 15 may optionally include the electrical connections extending through the carrier.

In Example 17, the subject matter of Example 15 may optionally include the electrical connections comprising a plurality of pins extending through the carrier.

In Example 18, the subject matter of any of Examples 10-17 may optionally include a plurality of screws through which the carrier is removably coupled to the printed circuit board.

In Example 19, the subject matter of any of Examples 10-18 may optionally include wherein the carrier includes an open region in a central portion thereof, and wherein a support structure is positioned within the open region, and wherein a central portion of the space transformer is positioned on the support structure.

In Example 20, the subject matter of any of Examples 10-19 may optionally include wherein the clamp extends above the space transformer a distance greater than that of the probe array.

In Example 21, the subject matter of any of Examples 10-19 may optionally include wherein the clamp extends above the space transformer a distance less than that of the probe array.

In Example 22, the subject matter of any of Examples 10-21 may optionally include a daughter board positioned between the space transformer and the carrier, wherein the space transformer is electrically coupled to the daughter board.

In Example 23, the subject matter of Example 22 may optionally include wherein the space transformer is positioned on the daughter board, and wherein the clamp is positioned to apply a force to the daughter board to couple the daughter board and the space transformer positioned thereon to the carrier.

In Example 24, the subject matter of any of Examples 1-23 may optionally include wherein the space transformer is positioned between at least part of the clamp and the carrier.

Example 25 is an electronic device assembly comprising: a space transformer comprising an organic substrate; a probe array positioned on the space transformer, wherein the space transformer is positioned between the probe array and the carrier; a printed circuit board, wherein the carrier is positioned between the printed circuit board and the space transformer; and means for removably coupling the space transformer to the printed circuit board.

In Example 26, the subject matter of Example 21 may optionally include means for electrically coupling the space transformer to the printed circuit board.

In Example 27, the subject matter of any of Examples 25-26 may optionally include wherein the means for removably coupling comprises a carrier on which the space transformer is positioned and a clamp positioned to hold the space transformer on the carrier.

In Example 28, the subject matter of any of Examples 25-27 may optionally include wherein the means for removably coupling includes an adhesive.

In Example 29, the subject matter of any of Examples 25-27 may optionally include wherein the means for removably coupling includes at least one screw.

Example 30 is a method for forming an electronic device assembly, comprising: positioning a space transformer on a carrier, the space transformer comprising an organic substrate; coupling the space transformer to the carrier using a clamp; bonding the space transformer to at least one of the clamp and the carrier using an adhesive, prior to the clamping the space transformer to the carrier; and electrically coupling the space transformer to a printed circuit board through electrical connections extending through the carrier.

In Example 31, the subject matter of Example 30 may optionally include wherein the electrically coupling the space transformer to the printed circuit board includes positioning a plurality of pins extending through one or more openings in the carrier.

In Example 32, the subject matter of any of Examples 30-31 may optionally include wherein the bonding the space transformer includes positioning the adhesive between at least one of: (i) the space transformer and the carrier, and (ii) the space transformer and the clamp.

In Example 33, the subject matter of any of Examples 30-32 may optionally include positioning a probe array on the space transformer.

In Example 34, the subject matter of Example 33 may optionally include positioning the probe array on the space transformer after the coupling the space transformer to the carrier using the clamp.

In Example 35, the subject matter of any of Examples 30-34 may optionally include removably coupling the carrier to the printed circuit board.

In Example 36, the subject matter of any of Examples 30-35 may optionally include coupling the carrier to the printed circuit board using a plurality of screws.

In Example 37, the subject matter of any of Examples 30-36 may optionally include coupling the clamp to the carrier using a plurality of screws.

In Example 38, the subject matter of any of Examples 30-37 may optionally include wherein the carrier defines an open region in a central portion thereof, and further comprising positioning a support structure in the open region, and positioning a central portion of the space transformer on the support structure.

In Example 39, the subject matter of any of Examples 33-38 may optionally include wherein the clamp is positioned to extend above the space transformer a distance greater than that of the probe array.

In Example 40, the subject matter of any of Examples 33-38 may optionally include wherein the clamp is positioned to extend above the space transformer a distance less than that of the probe array.

Example 41 is a method for forming an electronic device assembly, comprising: providing a space transformer comprising an organic substrate; positioning a probe array on the space transformer; removably coupling the space transformer to a printed circuit board; wherein the space transformer is positioned between the probe array and the printed circuit board; and wherein the space transformer is electrically coupled to the printed circuit board.

In Example 42, the subject matter of Example 41 may optionally include positioning the space transformer on a carrier, coupling the space transformer to the carrier using a clamp.

In Example 43, the subject matter of Example 42 may optionally include bonding the space transformer to at least one of the clamp and the carrier using an adhesive.

In Example 44, the subject matter of Example 43 may optionally include wherein the bonding is carried out prior to the coupling the space transformer to the carrier using the clamp.

In Example 45, the subject matter of Example 42-44 may optionally include positioning electrical connections extending through the carrier to electrically couple the space transformer to the printed circuit board.

In Example 46, the subject matter of Example 42-45 may optionally include positioning a plurality of pins extending through the carrier to electrically couple the space transformer to the printed circuit board.

In Example 47, the subject matter of Example 42-46 may optionally include positioning the probe array on the space transformer after the coupling the space transformer to the carrier using the clamp.

In Example 48, the subject matter of any of Examples 42-47 may optionally include removably coupling the carrier to the printed circuit board.

In Example 49, the subject matter of any of Examples 42-48 may optionally include coupling the carrier to the printed circuit board using a plurality of screws.

In Example 50, the subject matter of any of Examples 42-49 may optionally include coupling the clamp to the carrier using a plurality of screws.

In Example 51, the subject matter of any of Examples 42-50 may optionally include wherein the carrier defines an open region in a central portion thereof, and further comprising positioning a support structure in the open region, and positioning a central portion of the space transformer on the support structure.

In Example 52, the subject matter of any of Examples 42-51 may optionally include positioning the clamp to extend above the space transformer a distance greater than that of the probe array.

In Example 53, the subject matter of any of Examples 42-51 may optionally include positioning the clamp to extend above the space transformer a distance less than that of the probe array.

In Example 54, the subject matter of any of Examples 42-53 may optionally include positioning a daughter board between the space transformer and the carrier, wherein the space transformer is electrically coupled to the daughter board.

In Example 55, the subject matter of Example 54 may optionally include wherein the clamp is positioned to apply a force to the daughter board to couple the daughter board and the space transformer positioned thereon to the carrier.

In Example 56, the subject matter may include the formation of an electronic device assembly in accordance with any of Examples 30-55.

Example 57 is a computer program product, comprising a computer readable storage medium having computer readable program code embodied therein executable by a processor to implement a method or realize the apparatus of any one of Examples 1-56.

Various features described above have been grouped together for the purpose of streamlining the disclosure. This method of disclosure is not to be interpreted as reflecting an intention that the claimed embodiments of the invention require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art. For example, all optional features of the assembly structures as described above may also be implemented with respect to the methods described herein, and specific features in the examples may be used in one or more embodiments.

What is claimed:

1. An electronic device assembly comprising:
   a space transformer comprising an organic substrate, the space transformer including a first surface and a second surface opposite the first surface;
   a carrier on which the space transformer is positioned, wherein the second surface of the space transformer is positioned between the carrier and the first surface of the space transformer;
   a clamp positioned to extend over a portion of the first surface of the space transformer and couple the space transformer to the carrier, wherein the space transformer under the clamp is sandwiched between the clamp and the carrier;
   a probe assembly positioned on the first surface of the space transformer, wherein the space transformer is positioned between the probe assembly and the carrier, wherein the first surface of the space transformer is positioned between the probe assembly and the second surface of the space transformer; and
   the carrier configured to include a plurality of openings extending through the carrier, through which electrical connections may be made from the space transformer to a printed circuit board.

2. The electronic device assembly of claim 1, further comprising the printed circuit board and the electrical connections from the space transformer to the printed circuit board, the electrical connections extending through the openings in the carrier, the electrical connections comprising pins extending through the openings, the printed circuit board positioned to engage the carrier.

3. The electronic device assembly of claim 1, further comprising a pin holder positioned in a recess in the carrier, the pin holder including a plurality of pins electrically coupled to the space transformer.

4. The electronic device assembly of claim 2, including a plurality of screws through which the carrier is removably coupled to the printed circuit board.

5. The electronic device assembly of claim 1, wherein the carrier defines an open region extending through a thickness of the carrier in a central portion thereof, and wherein a support structure is positioned within the open region, and wherein a central portion of the space transformer is positioned on the support structure.

6. The electronic device assembly of claim 1, wherein the probe assembly comprises a probe holder and a plurality of probes, and wherein the clamp extends outward from the first surface of the space transformer a distance greater than that of the probe holder.

7. The electronic device assembly of claim 1, wherein the probe assembly comprises a probe holder and a plurality of probes, and wherein the clamp extends outward from the first surface of the space transformer a distance less than that of the probe holder.

8. The electronic device assembly of claim 1, further comprising a daughter board positioned between the space transformer and the carrier, wherein the space transformer is electrically coupled to the daughter board.

9. An electronic device assembly comprising:
   a space transformer comprising an organic substrate;
   a probe assembly comprising a plurality of test probes, the probe assembly positioned on the space transformer and the test probes electrically coupled thereto;
   a carrier on which the space transformer is positioned;
   the carrier configured to include a plurality of openings extending therethrough;
   a plurality of pins extending through the openings, wherein electrical connections may be made from the space transformer to a printed circuit board through the pins;
   a clamp coupled to the carrier, the clamp including a plate extending over a portion of the probe assembly and positioned to hold the space transformer on the carrier; and
   wherein the carrier is configured to removably engage a printed circuit board.

10. The electronic device assembly of claim 9, further comprising an adhesive positioned between the space transformer and at least one of the carrier and the clamp.

11. The electronic device assembly of claim 9, wherein the clamp is removably coupled to the carrier.

12. The electronic device assembly of claim 11, further comprising the printed circuit board, wherein the carrier is removably coupled to the printed circuit board using a first plurality of screws, and the clamp is removably coupled to the carrier using a second plurality of screws, wherein the second plurality of screws do not extend through any portion of the space transformer.

13. The electronic device assembly of claim 9, further comprising a plurality of pins extending through the openings in the carrier.

14. The electronic device assembly of claim 9, including a plurality of screws through which the clamp is removably coupled to the carrier, wherein the screws do not extend through any portion of the space transformer.

15. A method for forming an electronic device assembly, comprising:
    positioning a space transformer on a carrier, the space transformer comprising an organic substrate;
    clamping the space transformer to the carrier using a clamp comprising a plate extending over a first surface of the space transformer, wherein the space transformer under the clamp is sandwiched between the plate and the carrier;
    bonding the space transformer to at least one of the clamp and the carrier using an adhesive, prior to the clamping the space transformer to the carrier;
    coupling a probe assembly to the first surface of the space transformer, so that the space transformer is positioned between the probe assembly and the carrier;
    positioning a plurality of openings extending through the carrier and sized to accept pins extending therethrough; and
    positioning a plurality of pins to extend through the openings to form electrical connections between the space transformer and a printed circuit board.

16. The method of claim 15, wherein the bonding the space transformer includes positioning the adhesive between at least one of: (i) the space transformer and the carrier, and (ii) the space transformer and the clamp.

17. The method of claim 15, further comprising positioning a probe array on the space transformer after the clamping the space transformer to the carrier using the clamp.

18. An electronic device assembly comprising:
    a space transformer comprising an organic substrate, the space transformer including an upper surface and a lower surface;
    a carrier on which the lower surface of the space transformer is positioned;
    a clamp positioned to couple the space transformer to the carrier, the clamp comprising a plate configured to engage a portion of the upper surface of the space transformer;
    a probe assembly positioned on the upper surface of the space transformer, wherein the space transformer is positioned between the probe assembly and the carrier;
    the carrier configured to engage a printed circuit board; and
    the carrier configured to include a plurality of openings extending through the carrier; through which electrical connections may be made from the space transformer to the printed circuit board;
    the carrier configured to include a plurality of openings extending therethrough; and
    a plurality of pins extending through the openings in the carrier and electrically coupled the space transformer, the pins configured to be coupled to the printed circuit board, the openings configured to be larger than the pins so that a pin positioned in an opening is separated from an interior wall of the carrier by a portion of the opening.

19. The electronic device assembly of claim 18, wherein the space transformer includes a side surface, wherein the clamp includes a portion extending outward beyond the side surface, and wherein the clamp is coupled to the carrier through an attachment mechanism extending through the portion extending outward beyond the side surface.

20. The electronic device assembly of claim 1, further comprising a plurality of pins positioned in the openings.

21. The electronic device assembly of claim 20, the openings configured to be larger than the pins so that a pin positioned in an opening is separated from an interior wall of the carrier by a portion of the opening.

* * * * *